United States Patent
Liu et al.

(10) Patent No.: US 8,987,839 B2
(45) Date of Patent: Mar. 24, 2015

(54) GROUND SHIELD STRUCTURE AND SEMICONDUCTOR DEVICE

(71) Applicant: Semiconductor Manufacturing International (Shanghai) Corporation, Shanghai (CN)

(72) Inventors: Ling Liu, Shanghai (CN); Jenhao Cheng, Shanghai (CN); Xining Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 23 days.

(21) Appl. No.: 14/077,608

(22) Filed: Nov. 12, 2013

(65) Prior Publication Data

US 2014/0361417 A1    Dec. 11, 2014

(30) Foreign Application Priority Data

Jun. 9, 2013  (CN) .......................... 2013 1 0232109

(51) Int. Cl.
  *H01L 23/60*   (2006.01)
  *H01L 49/02*   (2006.01)
  *H01L 23/522*  (2006.01)

(52) U.S. Cl.
  CPC ............ *H01L 28/10* (2013.01); *H01L 23/5227* (2013.01); *H01L 2924/19042* (2013.01); *H01L 2924/19051* (2013.01); *H01L 2924/19104* (2013.01)
  USPC ........... 257/409; 257/508; 257/531; 257/659; 438/454

(58) Field of Classification Search
  CPC ............................. H01L 23/60; H01L 23/5225
  USPC ................... 257/409, 508, 531, 659; 438/454
  See application file for complete search history.

(56) References Cited

U.S. PATENT DOCUMENTS

| | | | |
|---|---|---|---|
| 2004/0222511 A1* | 11/2004 | Zhang | 257/686 |
| 2006/0163692 A1* | 7/2006 | Detecheverry et al. | 257/531 |
| 2009/0200647 A1* | 8/2009 | Mondal et al. | 257/659 |
| 2014/0117496 A1* | 5/2014 | Cheng et al. | 257/531 |
| 2014/0361401 A1* | 12/2014 | Wang et al. | 257/531 |

* cited by examiner

*Primary Examiner* — George Fourson, III
(74) *Attorney, Agent, or Firm* — Anova Law Group, PLLC

(57) ABSTRACT

Various embodiments provide ground shield structures, semiconductor devices, and methods for forming the same. An exemplary structure can include a substrate and a dielectric layer disposed on the substrate. The structure can further include multiple conductive rings disposed in the substrate, in the dielectric layer, and/or on the dielectric layer. Each conductive ring of the multiple conductive rings can have openings of about three or more, and the openings of the each conductive ring can divide the multiple conductive rings into a plurality of sub-conductive rings arranged spaced apart. The structure can further a ground ring electrically connected to each of the plurality of sub-conductive rings.

20 Claims, 8 Drawing Sheets

GROUND SHIELD STRUCTURE AND SEMICONDUCTOR DEVICE

CROSS-REFERENCES TO RELATED APPLICATIONS

This application claims priority to Chinese Patent Application No. CN201310232109.3, filed on Jun. 9, 2013, the entire contents of which are incorporated herein by reference.

FIELD OF THE DISCLOSURE

The present disclosure relates to the field of semiconductor technology and, more particularly, relates to ground shield structures and semiconductor devices having the ground shield structures.

BACKGROUND

In current integrated circuits (ICs), such as complementary metal-oxide-semiconductor radio-frequency (CMOS RF) circuits, inductor is an important electrical device. Performance parameters of an inductor can directly affect performance of an IC. Conventionally, most inductors in ICs are planar inductors, such as planar spiral inductors. The planar inductors are formed by winding a metal wire on a surface of a substrate or a dielectric layer. In comparison with traditional coils or coil inductors, the planar inductors have advantages such as low cost, ease of integration, low noise and low power consumption. More importantly, the planar inductors can be compatible with current IC processes.

Performance of an inductor is characterized by a quality factor Q of the inductor. The quality factor Q is a ratio of energy stored in the inductor to energy loss during each oscillation cycle. The higher the quality factor Q of the inductor, the greater the efficiency and the better the performance of the inductor. The energy loss of the inductor is an important factor that affects the value of Q. Substrate loss in an IC accounts for the largest proportion of the energy loss of the inductor. That is, the substrate loss is an important factor that affects the quality factor Q of the inductor.

Conventionally, on one hand, a planar inductor is disposed on an IC, so electric field lines can enter a substrate and lead to electric charge movements in the substrate to generate a coupling substrate current. The current can lead to ohmic loss in the substrate. On the other hand, an alternating current in the inductor generates an alternating magnetic field (i.e., an induced alternating magnetic field), which can vertically enter the substrate through the surface of the substrate to generate an alternating eddy current in the substrate. The eddy current can dissipate electric energy (converted from magnetic energy) as Joule heat, which causes eddy current loss. The ohmic loss and the eddy current loss can result in a significant substrate loss, which can significantly reduce the quality factor Q.

Therefore, currently, a ground shield structure is provided between the inductor and the substrate. The ground shield structure serves to shield the electric field lines and the induced magnetic field lines of the inductor, such that the electric field lines and the induced magnetic field lines can terminate at the ground shield structure instead of entering the substrate. The substrate loss can thus be reduced.

Although the existing ground shield structure can reduce the substrate loss, in practical applications, after the existing ground shield structure is introduced into a semiconductor device containing the inductor, the quality factor Q of the inductor is not improved. To the contrary, the quality factor Q of the inductor is even reduced in some bands of operating frequency of the inductor.

Referring to FIG. 1, a curve 01 corresponds to a Q value of an inductor not having a ground shield structure, and a curve 02 corresponds to a Q value of an inductor having an existing ground shield structure. In an operating frequency band of the inductor that is higher than $10\times10^9$ Hz, the Q value of the inductor having the ground shield structure is not significantly greater than the Q value of the inductor not having the ground shield structure. Moreover, in an operating frequency band of the inductor that is lower than $10\times10^9$ Hz, the Q value of the inductor having the ground shield structure is lower than the Q value of the inductor not having the ground shield structure.

BRIEF SUMMARY OF THE DISCLOSURE

One aspect of the present disclosure includes a ground shield structure. An exemplary structure can include a substrate and a dielectric layer disposed on the substrate. The structure can further include multiple conductive rings disposed in the substrate, in the dielectric layer, and/or on the dielectric layer. Each conductive ring of the multiple conductive rings can have openings of about three or more, and the openings of the each conductive ring can divide the multiple conductive rings into a plurality of sub-conductive rings arranged spaced apart. The structure can further include a ground ring electrically connected to each of the plurality of sub-conductive rings.

Another aspect of the present disclosure includes a method for forming a ground shield structure: An exemplary method can include providing a dielectric layer on a substrate. The method can further include configuring multiple conductive rings in the substrate, in the dielectric layer, and/or on the dielectric layer. Each conductive ring of the multiple conductive rings can have openings of about three or more, and the openings of the each conductive ring can divide the multiple conductive rings into a plurality of sub-conductive rings arranged spaced apart. The method can further include connecting a ground ring to each of the plurality of sub-conductive rings.

Yet another aspect of the present disclosure includes a semiconductor device. An exemplary device can include a ground shield structure and an induction device disposed on the ground shield structure. The structure can include a substrate and a dielectric layer disposed on the substrate. The structure can further include multiple conductive rings disposed in the substrate, in the dielectric layer, and/or on the dielectric layer. Each conductive ring of the multiple conductive rings can have openings of about three or more, and the openings of the each conductive ring can divide the multiple conductive rings into a plurality of sub-conductive rings arranged spaced apart. The structure can further include a ground ring electrically connected to each of the plurality of sub-conductive rings.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A ground shield structure is often provided between an inductor and a substrate. The ground shield structure may not improve a quality factor Q of the inductor. When a high-frequency signal is applied to the inductor, the inductor can introduce a significant parasitic effect into the ground shield structure. The parasitic effect can include a parasitic resistance and a parasitic capacitance, which can result in a large amount of energy loss, thus reducing the quality factor Q of the inductor.

Figure 1:
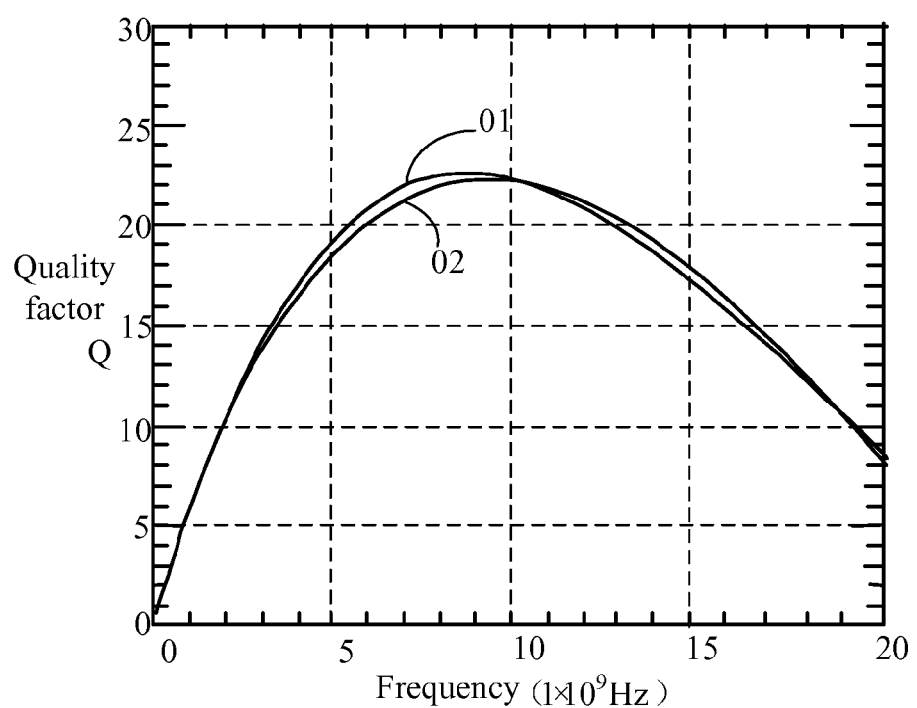
FIG. 1 depicts a relationship between an operating frequency and a Q value of each of an inductor not having a ground shield structure and an inductor having an existing ground shield structure.
Figure 2:
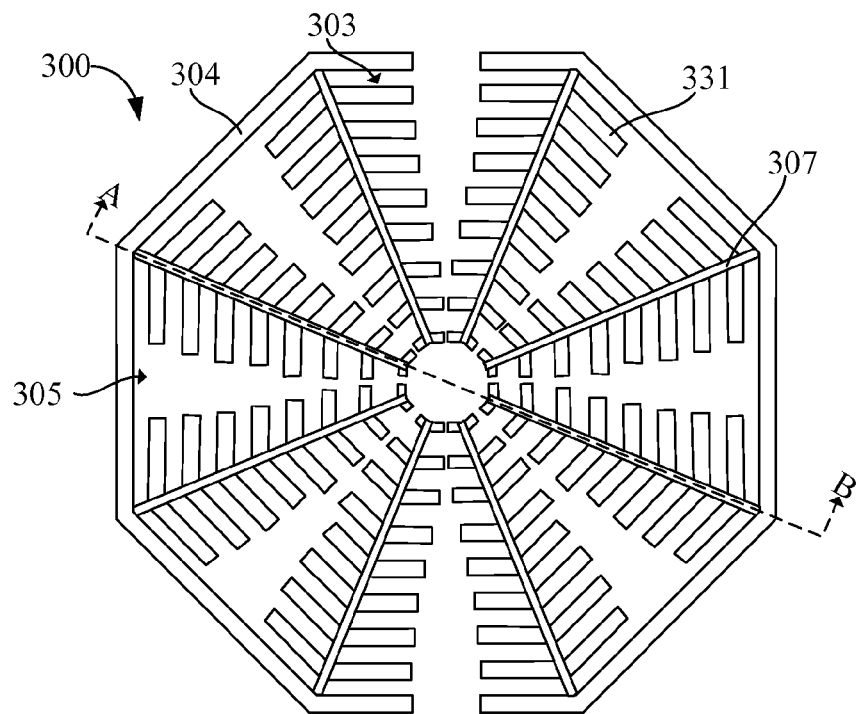
FIG. 2 depicts a top view of an exemplary ground shield structure (e.g., including multi-ring conductive rings, a ground ring, and/or interconnects) in accordance with various disclosed embodiments.
Figure 3:
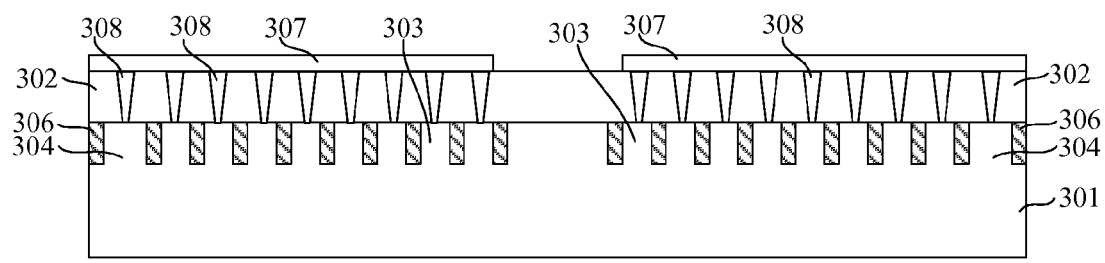
FIG. 3 depicts a cross-sectional view of the exemplary ground shield structure along an AB direction as shown in FIG. 2 in accordance with various disclosed embodiments.

Various embodiments provide a ground shield structure and a semiconductor device having the ground shield structure. For example, FIG. 2 depicts a top view of an exemplary ground shield structure (e.g., including multi-ring conductive rings, a ground ring, and/or interconnects) in accordance with various disclosed embodiments. FIG. 3 depicts a cross-sectional view of the exemplary ground shield structure along an AB direction as shown in FIG. 2 in accordance with various disclosed embodiments.

Referring to FIGS. 2-3, a ground shield structure 300 can include a substrate 301, a dielectric layer 302 disposed on the substrate 301, and conductive rings 303 in the substrate 301.

The conductive rings 303 can include multiple rings, i.e., having a multi-ring structure. In one embodiment, the conductive rings 303 can include first-active rings. Adjacent first-active rings can be separated by annular isolation structures 306. Each conductive ring 303 can have a plurality of openings 305, e.g., about 8 openings 305 in the example as shown in FIG. 2. The openings 305 can divide each conductive ring 303 into a plurality of spaced sub-conductive rings 331.

Further, the ground shield structure 300 can include a ground ring 304. The ground ring 304 can be a third-active ring located in the substrate 301 and surrounding the conductive rings 303. The ground ring 304 and the conductive rings 303 can be separated by the annular isolation structures 306. For illustrative purposes, one ground ring is shown in this example. However, in various embodiments, there can be more than one ground rings, without limitation.

In addition, the ground shield structure 300 can include interconnects 307 located on the dielectric layer 302. The ground ring 304 can be electrically connected to the interconnects 307 via conductive plugs 308. The sub-conductive rings 331 of two adjacent conductive rings 303 in a radial direction can be electrically connected to one of the interconnects 307 via the conductive plugs 308.

Referring to FIG. 2, in one embodiment, the conductive rings 303 can have a regular (e.g., symmetric) shape, for example, an octagonal shape. Correspondingly, the conductive rings 303 can have about 8 openings. That is, an opening can be formed at each side of the octagonal shape, so a pattern of the conductive rings 303 can be more symmetric. However, in other embodiments, the number of the openings may not necessarily correspond to the shape of the conductive rings 303. For conductive rings 303 having any shape, the number of the openings of the conductive rings 303 can be any number greater than or equal to about 3. In various embodiments, the openings can be symmetrically configured in each of the conductive rings 303.

In various embodiments, each of the conductive rings 303 can serve as a parasitic resistor between the substrate 301 and an inductor. When the ground shield structure 300 is placed under the inductor and a high-frequency signal is applied to the inductor, the high-frequency signal in the inductor can generate an induced alternating magnetic field perpendicular to a surface of the substrate 301. The induced alternating magnetic field can be applied to the parasitic resistor, causing electric charge movements in the parasitic resistor, which can result in an energy loss.

In various embodiments, the openings 305 can divide each conductive ring 303 into a plurality of spaced sub-conductive rings 331. Thus, a parasitic resistance of each conductive ring 303 can be reduced, in comparison with a conductive ring without openings. A reduction in the parasitic resistance of each conductive ring 303 can cause a reduction of a total parasitic resistance of the multi-ring conductive rings 303, which can reduce the energy loss of the inductor caused by conventional ground shield structures and significantly increase the quality factor Q of the resultant inductor.

Generally, on one hand, the more the openings 305 of the conductive rings 303, the lower the parasitic resistance. On the other hand, if there are too many openings 305, many induced magnetic field lines may enter the substrate 301 through the opening 305 and a desired shielding effect may not be achieved. For example, the number of openings 305 of the conductive rings 303 in FIG. 2 can be greater than or equal to 3, and/or less than or equal to 8, and the desired shielding effect may be achieved.

In various embodiments, when the inductor is disposed on the ground shield structure 300, and a high-frequency signal is applied to the inductor coil (or the inductor), electric potentials at junctions between the interconnect 307 and the sub-conductive rings 331 can be fixed. There can be no electric charge movement in the interconnect 307 between two adjacent junctions. However, under the high-frequency signal, an electric potential away from one of the junctions can be unequal, i.e., unequal to the electric potential at the junction. So a potential difference can be established, and mobile charge can be induced in a sub-conductive ring 331 away from the junction.

Therefore, under the high-frequency signal, the sub-conductive rings 331 of two adjacent conductive rings 303 configured with a same interconnect 307 can face each other in the radial direction to form a coupling capacitor. Each sub-conductive ring 331 can be regarded as an electrode plate of the coupling capacitor. Thus, the multiple sub-conductive rings 331 electrically connected to the same interconnect 307 can form multiple coupling capacitors between each other. For example, two adjacent sub-conductive rings 331 can form one coupling capacitor. The interconnect 307 can electrically connect the multiple coupling capacitors, which can be equivalent to electrically connecting the multiple coupling capacitors in series.

After connecting the multiple coupling capacitors in series, a total coupling capacitance can be a parasitic capacitance between the substrate 301 and the inductor. Connecting the multiple coupling capacitors in series can reduce the total coupling capacitance, which can equivalently reduce the parasitic capacitance between the substrate 301 and the inductor. The reduction of the parasitic capacitance can result in a reduction of the energy loss of the inductor in the ground shield structure, thus increasing the quality factor Q of the inductor.

Referring to FIG. 2, to further enhance the shielding effect, in some embodiments, the multi-ring conductive rings 303 can be concentric electrically conductive rings. A distance between two adjacent conductive rings 303 can be equal. Thus, the electric field lines and the induced magnetic field lines of the inductor can be uniformly shielded along circumferential and/or radial directions. Further, each of the conductive rings 303 can have an equal number of openings 305, e.g., about 8. The openings 305 can be equally spaced. The openings 305 of two adjacent conductive rings 303 can have a one-to-one correspondence with (i.e., can be consistent with) each other. In various embodiments, the openings in each of adjacent conductive rings are consistent in radial directions. Thus, along the circumferential and radial directions, the electric field lines and the induced magnetic field lines of the inductor can be uniformly shielded.

In other embodiments, when each of the multiple conductive rings 303 does not have an equal number of the openings 305, a shielding effect can be achieved, but the achieved shielding effect may not be uniform and may not be satisfactory. In addition, each interconnect 307 can electrically connect midpoints of two adjacent sub-conductive rings 331 in the radial direction, so distribution density of the interconnects 307 can be uniform. This can result in a desired and uniform shielding effect.

Referring to FIGS. 2-3, in one embodiment, the conductive rings 303 and the ground ring 304 can be active rings located in the substrate 301. Therefore, the conductive rings 303 and the ground ring 304 can be formed in a same step, which can save time and cost for manufacturing.

For example, multiple spaced annular isolation structures 306 can first be formed in the substrate 301. Of any two annular isolation structures 306, one annular isolation structure 306 can be enclosed by another annular isolation structure 306. The substrate 301 between the two adjacent annular isolation structures 306 can be doped with impurities to form the active rings (e.g., using a diffusion process).

Next, the plurality of openings 305 can be formed in each of the active rings. For example, an outermost active ring can be the ground ring 304. The ground ring 304 can have about 2 openings, which can prevent the induced magnetic field lines from generating an eddy current in the ground ring 304. The active rings enclosed by the outermost active ring can be the conductive rings 303. The conductive rings 303 can have about 8 openings 305.

The dielectric layer 302 can then be deposited. The conductive plugs 308 can be formed in the dielectric layer 302 to electrically connect to the ground ring 304 and the sub-conductive rings 331.

Further, the interconnects 307 can be formed on the dielectric layer 302. Each of the interconnects 307 can electrically connect to the sub-conductive rings 331 of the conductive rings 303 and the ground ring 304 in the radial direction. Corresponding to a number of the sub-conductive rings 331 in each conductive ring 303 (e.g., about 8), about 8 interconnects 307 can be formed.

In one embodiment, the interconnects 307 can be made of a material including aluminum, and can be formed by a process including a deposition step and/or an etching step. In another embodiment, the interconnects 307 can be made of a material including copper, and can be formed by a process including a dual-Damascene process. In one embodiment, the interconnects 307 and the conductive plugs 308 can be formed in a same step.

In some embodiments, a number of the conductive rings 303 can be about 8, which is not limited in the present disclosure. In other embodiments, the number of the conductive rings 303 can range from about 2 to about 100, e.g., about 10, about 20, or about 50.

In some embodiments, the conductive rings 303 can have a regular (e.g., symmetric) octagonal shape. In other embodiments, the conductive rings 303 can have a triangular, square, circular shape, etc. The shape of the conductive rings 303 and the shape of the ground ring 304 can be the same. For example, in one embodiment, the conductive rings 303 and the ground ring 304 can have an octagonal shape. In other embodiments, the shape of the conductive rings 303 and the shape of the ground ring 304 can be different. When the conductive rings 303 and the ground ring 304 have the same shape, the formed pattern can be more regular (e.g., symmetric). In one embodiment, each of the conductive rings 303 and the ground ring 304 can have a width ranging from about 0.1 micron to about 100 microns.

According to various embodiments, the process for forming the ground ring 304 and the multi-ring conductive rings 303 can be compatible with CMOS processes. For example, the substrate 301 can include one or more materials used in CMOS process, e.g., silicon, germanium, silicon-on-insulator, silicon carbide, silicon-germanium, gallium nitride, glass, etc. In one embodiment, the substrate 301 can be a p-type silicon substrate.

Figure 4:
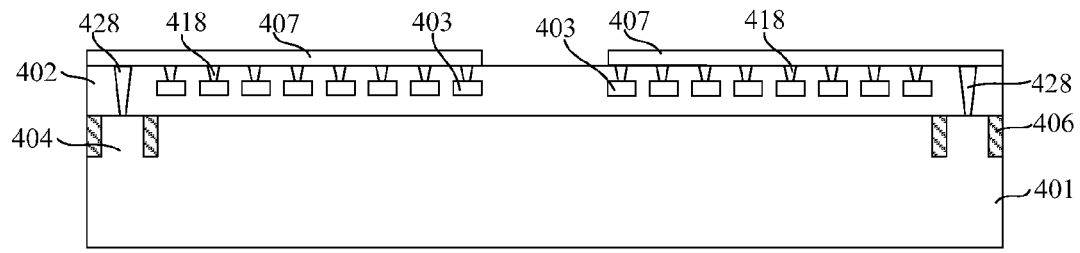
FIG. 4 depicts a cross-sectional view of another exemplary ground shield structure in accordance with various disclosed embodiments.

FIG. 4 depicts a cross-sectional view of another exemplary ground shield structure in accordance with various disclosed embodiments. In this example, conductive rings can be polycrystalline silicon (or polysilicon) rings in a dielectric layer.

Referring to FIG. 4, conductive rings 403 can be polysilicon rings in a dielectric layer 402. The conductive rings 403 can include multiple rings, i.e., having a multi-ring structure. Two adjacent conductive rings 403, or two adjacent sub-conductive rings can be separated by the dielectric layer 402. The conductive rings 403 can be separated from a substrate

401 by the dielectric layer 402. The sub-conductive rings of each of the conductive rings 403 can be electrically connected to interconnects 407 via first conductive plugs 418. A number of the first conductive plugs 418 can be equal to a number of the sub-conductive rings. A ground ring 404 can be a third-active ring in the substrate 401, and can be electrically connected to the interconnects 407 via second conductive plugs 428, and separated from a surrounding portion of the substrate 401 by annular isolation structures 406. On a surface of the substrate 401, a projection of the conductive rings 403 can be within a range of a projection of the ground ring 404.

In addition, parameters of the conductive rings 403, e.g., shape, number, number of openings, and arrangement of the openings can be similar to or the same as described above in accordance with various embodiments. A shielding effect achieved by the ground shield structure in this example can be the same as or similar to the shielding effect achieved by the ground shield structures as described above in accordance with various embodiments.

In this case, a method for forming the ground shield structure in accordance with various embodiments can include the following steps. First, the third-active ring can be formed in the substrate 401 as the ground ring 404. The annular isolation structures 406 can be formed on both sides of the third-active ring.

Next, a first dielectric layer can be disposed on the substrate 401 and a polysilicon layer can be disposed on the first dielectric layer. The polysilicon layer can be patterned to form the multi-ring polysilicon rings. On the surface of the substrate 401, the projection of the polysilicon rings can be enclosed by the projection of the ground ring 404. The polysilicon rings can have a plurality of openings and can serve as the conductive rings 403.

A second dielectric layer can then be deposited, and the first conductive plugs 418 can be formed in the second dielectric layer to electrically connect to the sub-conductive rings. The second conductive plugs 428 of the third-active ring can be formed in the first dielectric layer and the second dielectric layer. The first dielectric layer and the second dielectric layer together can form the dielectric layer 402. The interconnects 407 can be formed on the dielectric layer 402. A location and structure of the interconnects 407, and positions of junctions between the interconnects 407 and the sub-conductive rings and the ground ring can be similar to or the same as described above in accordance with various embodiments.

Figure 5:
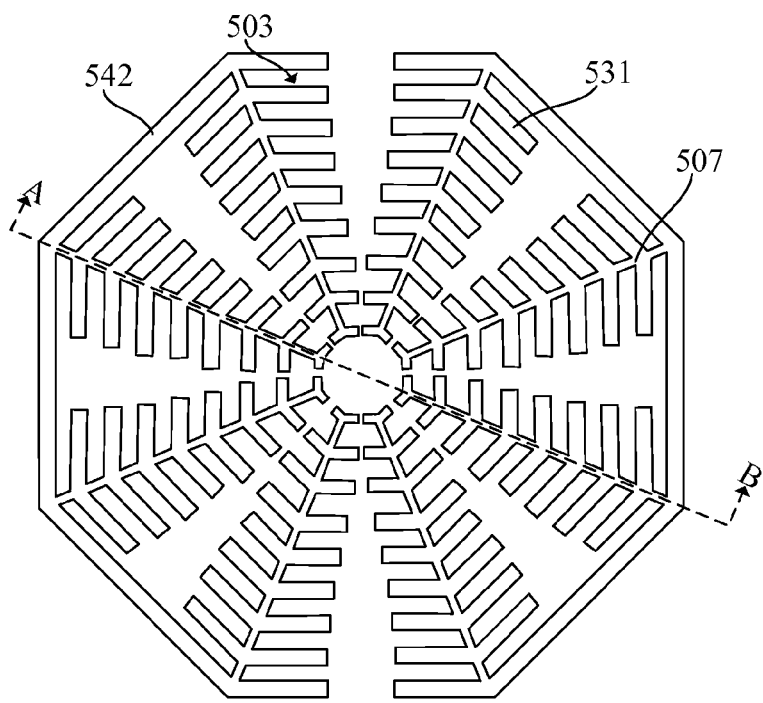
FIG. 5 depicts a top view of another exemplary ground shield structure (e.g., including multi-ring conductive rings, a ground ring, and/or interconnects) in accordance with various disclosed embodiments.
Figure 6:
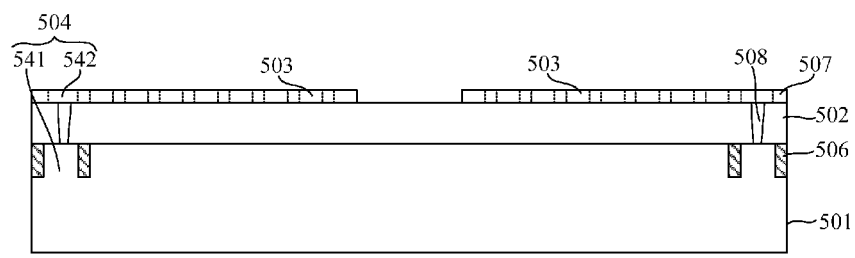
FIG. 6 depicts a cross-sectional view of the exemplary ground shield structure along an AB direction as shown in FIG. 5 in accordance with various disclosed embodiments.

FIG. 5 depicts a top view of another exemplary ground shield structure (e.g., including multi-ring conductive rings, a ground ring, and/or interconnects) in accordance with various disclosed embodiments. FIG. 6 depicts a cross-sectional view of the exemplary ground shield structure along an AB direction as shown in FIG. 5 in accordance with various disclosed embodiments. In this example, conductive ring can be metal rings.

In some embodiments, referring to FIGS. 5-6, conductive rings 503 can be first metal rings on a dielectric layer 502. The conductive rings 503 can include multiple rings, i.e., having a multi-ring structure. The conductive rings 503 and interconnects 507 can be in a same plane and connected with each other, and can be separated from a substrate 501 by the dielectric layer 502.

A ground ring 504 can include a third-active ring 541 in the substrate 501 and a second metal ring 542 above the third-active ring 541. Annular isolation structures 506 can be formed on both sides of the third-active ring 541, and can separate the third-active ring 541 from other portions of the substrate 501. The second metal ring 542 can be electrically connected to the third-active ring 541 via conductive plugs 508. The second metal ring 542 and the conductive rings 503 can be in the same plane with the interconnects 507 and connected with each other.

In this case, a method for forming the ground shield structure in accordance with various embodiments can include the following steps. First, the third-active ring 541 can be formed in the substrate 501. The annular isolation structures 506 can be formed on both sides of the third-active ring 541.

Next, the dielectric layer 502 can be formed on the substrate 501. The conductive plugs 508 can be formed in the dielectric layer 502 to electrically connect the third-active ring 541.

The second metal ring 542, the first metal rings enclosed by the second metal ring 542, and the interconnects 507 connecting the second metal ring 542 and the first metal rings, can then be formed on the dielectric layer 502. The first metal rings can be used as the conductive rings 503. Sub-conductive rings 531 of adjacent conductive rings 503 can be connected by one of the interconnects 507 in the radial direction.

Parameters of the conductive rings 503, e.g., shape, number, number of openings, and arrangement of the openings can be similar to or the same as described above in accordance with various embodiments. A shielding effect achieved by the ground shield structure in this example can be the same as or similar to the shielding effect achieved by the ground shield structures as described above in accordance with various embodiments.

In other embodiments, the first metal rings can be in a different plane from the interconnects. The first metal rings can be in the dielectric layer and electrically connected to the interconnects via the conductive plugs (e.g., as shown in FIG. 4). In this case, the first metal rings and the second metal ring can be in a same plane, and can be electrically connected to the interconnects via the conductive plugs. Optionally, the second metal ring can be electrically connected to the third-active ring via the conductive plugs. In one embodiment, the ground ring can include the third-active ring without the second metal ring, and can be electrically connected to the interconnects.

In this case, a density of metal in the ground shield structure can be significantly reduced. So the energy loss of the inductor in the conductive rings 503 can be reduced, and the quality factor Q can be increased. Moreover, the first metal rings, the second metal ring 542 and the interconnects 507 can be formed in a same process. On one hand, process steps can be saved and manufacturing efficiency can be increased. On the other hand, conductive plug structures for connecting the sub-conductive rings 531 and the interconnects 507 can be omitted, so material consumption and fabrication cost can be reduced.

Figure 7:
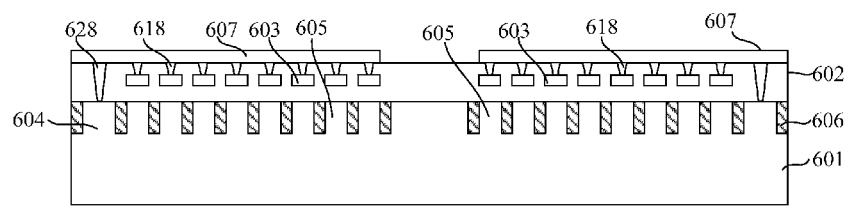
FIG. 7 depicts a cross-sectional view of another exemplary ground shield structure in accordance with various disclosed embodiments.

FIG. 7 depicts a cross-sectional view of another exemplary ground shield structure in accordance with various disclosed embodiments. In this example, in comparison with various disclosed embodiments (e.g., in FIG. 4), the ground shield structure can further include second-active rings 605 in a substrate 601. Two adjacent second-active rings 605 can be separated by an annular isolation structure 606. Conductive rings 603 can be polysilicon rings in a dielectric layer 602, and can be separated from the substrate 601 by the dielectric layer 602. The conductive rings 603 and the second-active rings 605 can include multiple rings, i.e., having a multi-ring structure. The conductive rings 603 can be above the second-active rings 605 with a one-to-one correspondence in a direction perpendicular to a surface of the substrate 601. The second-active rings 605 can have the similar or same parameters, e.g., shape, openings (e.g., a number of the openings), number (e.g., the number of the rings), and/or arrangement, as the conductive rings 603. The ground ring 604 can be a third-active ring, and can enclose the second-active rings 605. Sub-conductive rings can be electrically connected to interconnects 607 via first conductive plugs 618. The ground ring 604 can be electrically connected to the interconnects 607 via second conductive plugs 628.

In this example, the conductive rings 603 and the second-active rings 605 can be equivalent to double "barriers", which can enhance a shielding effect of the ground shield structure. When the conductive rings 603 shield most of the electric field lines and/or induced magnetic field lines, and a small amount of the electric field lines and/or induced magnetic field lines pass through the second-active rings 605, the second-active rings 605 can provide a further shielding effect to prevent an eddy current loss of the inductor in the substrate and achieve a better shielding effect.

Further details, variations of the ground shield structure, etc., and methods for forming the ground shield structure in this case can be similar to or the same as described above (e.g., in FIG. 4) in accordance with various embodiments.

Figure 8:
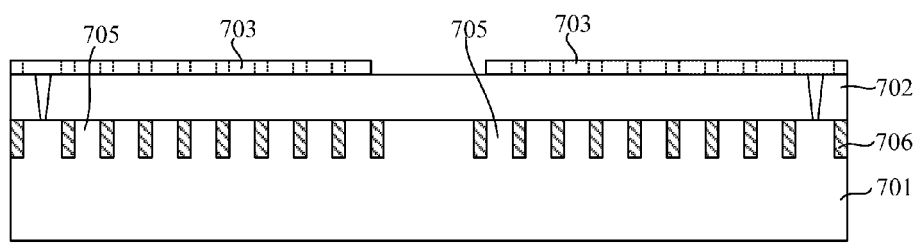
FIG. 8 depicts a cross-sectional view of another exemplary ground shield structure in accordance with various disclosed embodiments.

FIG. 8 depicts a cross-sectional view of another exemplary ground shield structure in accordance with various disclosed embodiments. In this example, in comparison with various disclosed embodiments (e.g., in FIGS. 5-6), the ground shield structure can further include second-active rings 705 in a substrate 701. Two adjacent second-active rings 705 can be separated by annular isolation structures 706. Conductive rings 703 can be metal rings on a dielectric layer 702, and can be separated from the substrate 701 by the dielectric layer 702. The conductive rings 703 and the second-active rings 705 can include multiple rings, i.e., having a multi-ring structure. The conductive rings 703 can be above the second-active rings 705 with a one-to-one correspondence in a direction perpendicular to a surface of the substrate 701. The second-active rings 705 can have the similar or same parameters, e.g., shape, openings (e.g., a number of the openings), number (e.g., the number of the rings), and/or arrangement, as the conductive rings 703.

In this example, the second-active rings 705 can enhance the shielding effect of the ground shield structure. Further details, variations of the ground shield structure, etc., and methods for forming the ground shield structure in this case can be similar to or the same as described above (e.g., in FIGS. 5-6) in accordance with various embodiments.

Figure 9:
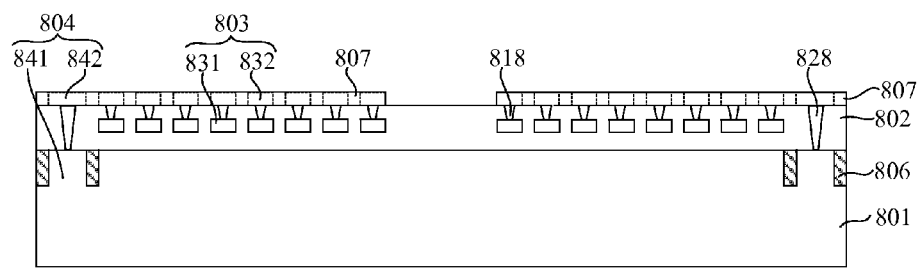
FIG. 9 depicts a cross-sectional view of another exemplary ground shield structure in accordance with various disclosed embodiments.

FIG. 9 depicts a cross-sectional view of another exemplary ground shield structure in accordance with various disclosed embodiments. In this example, conductive rings 803 can have a two-layer structure, including polysilicon rings 831 in a dielectric layer 802 and first metal rings 832. The first metal rings 832 can be above the polysilicon rings 831 and electrically connected to the polysilicon rings 831 via first conductive plugs 818. The polysilicon rings 831 and the first metal rings 832 can have a one-to-one correspondence (i.e., can be consistent) in a direction perpendicular to a surface of a substrate 801. The polysilicon rings 831 can be separated from the substrate 801 by the dielectric layer 802.

A ground ring 804 can include a third-active ring 841 in the substrate 801 and a second metal ring 842 above the third-active ring 841. The second metal ring 842 can be electrically connected to the third-active ring 841 via second conductive plugs 828. The third-active ring 841 can be separated from other portions of the substrate 801 by annular isolation structures 806. The first metal rings 832, the second metal ring 842 and interconnects 807 can be in a same plane, and can be formed in a same process. The interconnects 807 can be connected to the first metal rings 832 and the second metal ring 842 as a whole.

In this case, the conductive rings 803 having the two-layer structure can enhance the shielding effect of the ground shield structure. Further details, variations of the ground shield structure, etc., and methods for forming the ground shield structure in this case can be similar to or the same as described above (e.g., in FIGS. 2-8) in accordance with various embodiments.

Figure 10:
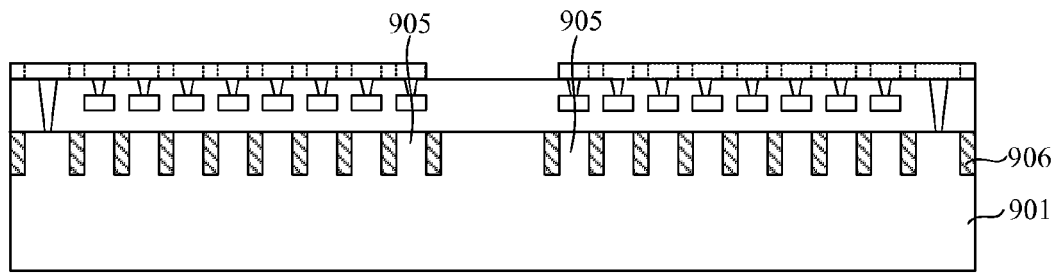
FIG. 10 depicts a cross-sectional view of another exemplary ground shield structure in accordance with various disclosed embodiments.

FIG. 10 depicts a cross-sectional view of another exemplary ground shield structure in accordance with various disclosed embodiments. In this example, in comparison with various disclosed embodiments (e.g., in FIG. 9), the ground shield structure can further include second-active rings 905 in a substrate 901. Adjacent second-active rings 905 can be separated by annular isolation structures 906.

Further details, variations of the ground shield structure, etc., and methods for forming the ground shield structure in this case can be similar to or the same as described above (e.g., as shown in FIG. 9) in accordance with various embodiments.

In this case, the shielding effect of the ground shield structure can be further enhanced in comparison with various disclosed embodiments (e.g., in FIG. 9).

Accordingly, there is provided a semiconductor device including a ground shield structure in accordance with various disclosed embodiments. For example, the semiconductor device can include the ground shield structure, and an induction device on the ground shield structure. The induction device can include an inductor, a transformer and/or a balun. In one embodiment, the induction device can be an inductor, and the inductor can be a planar spiral inductor.

Figure 11:
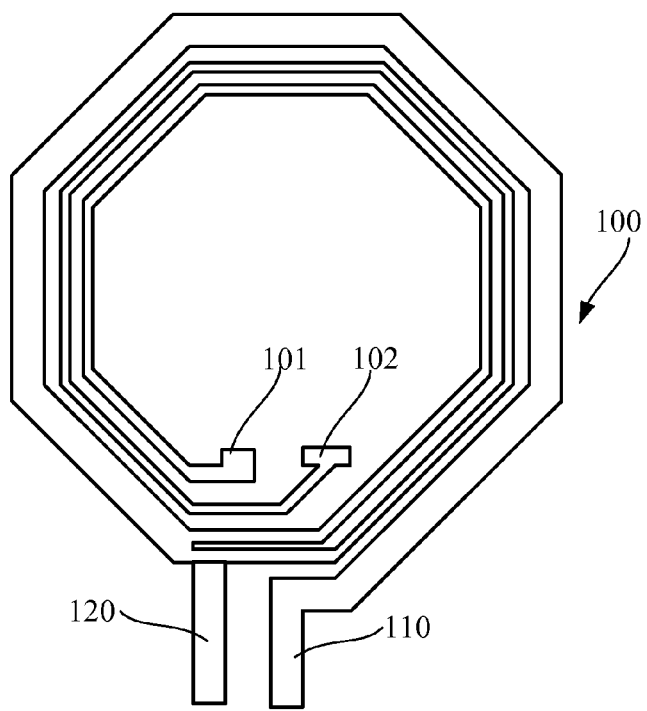
FIGS. 11-12 depict top views of an exemplary planar spiral inductor in accordance with various disclosed embodiments.
Figure 12:
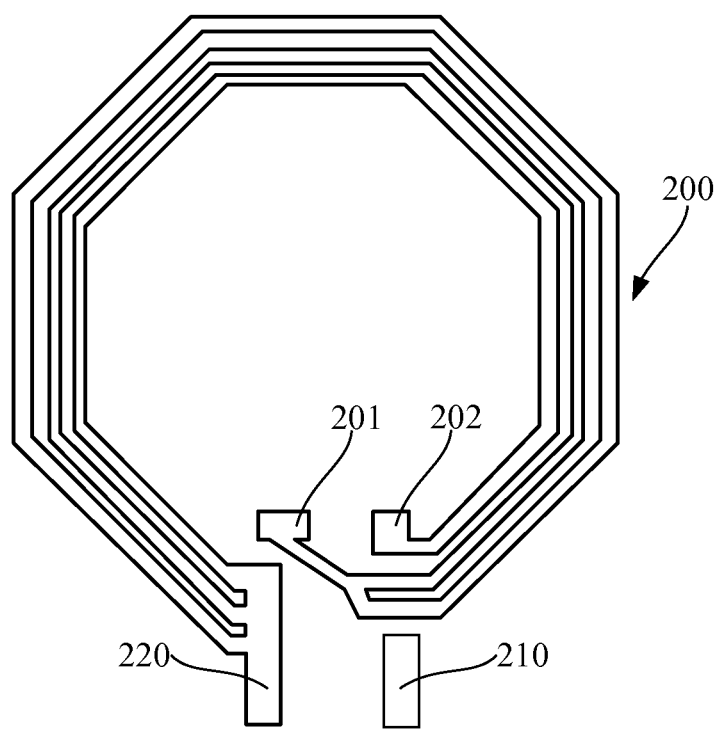

FIGS. 11-12 depict top views of an exemplary planar spiral inductor in accordance with various disclosed embodiments. FIG. 11 depicts a top view of a first planar spiral ring of the inductor. FIG. 12 depicts a top view of a second planar spiral ring of the inductor.

Referring to FIG. 11, the first planar spiral ring is located above an insulating layer (not shown). The insulating layer can be on a top of a ground shield structure. The first planar spiral ring can include a first metal ring 100, a contact point 101, a contact point 102, a contact layer 110 and a contact layer 120.

Referring to FIG. 12, the second planar spiral ring is located above the first planar spiral ring. There can be a dielectric layer between the first planar spiral ring and the second planar spiral ring. The second planar spiral ring can include a metal ring 200, a contact point 201, a contact point 202, a contact layer 210 and a contact layer 220.

The contact points of the first planar spiral ring and of the second planar spiral ring can be electrically connected via conductive plugs through the dielectric layer between the first planar spiral ring and the second planar spiral ring. For example, the contact point 101 and the contact point 201 can be electrically connected via conductive plug(s). The contact point 102 and the contact point 202 can be electrically connected via conductive plug(s). The contact layer 110 and the contact layer 210 can be electrically connected via conductive plug(s). The contact layer 120 and the contact layer 220 can be electrically connected via conductive plug(s).

In one embodiment, the planar spiral inductor (e.g., the first planar spiral ring and/or the second planar spiral ring) can have an octagonal shape, without limitation. For example, the first planar spiral ring and the second planar spiral ring can have a triangular, square, circular or octagonal shape, and the shape can be the same as or different from the conductive rings of the ground shield structure. The planar spiral inductor can include multiple planar spiral rings configured as a multi-layer structure. The shape of the rings of the planar spiral inductor (e.g., the first planar spiral ring and/or the second planar spiral ring) can be the same as or different from the rings (e.g., the conductive rings) of the ground shield structure.

In other embodiments, an induction device, e.g., a transformer, a balun, etc., can be formed above the ground shield structure. The induction device can generate a magnetic field to form an eddy current in the substrate and cause an eddy current loss. In various embodiments, in a direction perpendicular to a surface of the substrate, a projection of the induction device, e.g., the inductor, the transformer, the balun, etc., can be within the range of a projection of the ground shield structure. Thus, the magnetic field generated by the induction device that is perpendicular to the substrate can be within the range of the ground shield structure.

Figure 13:
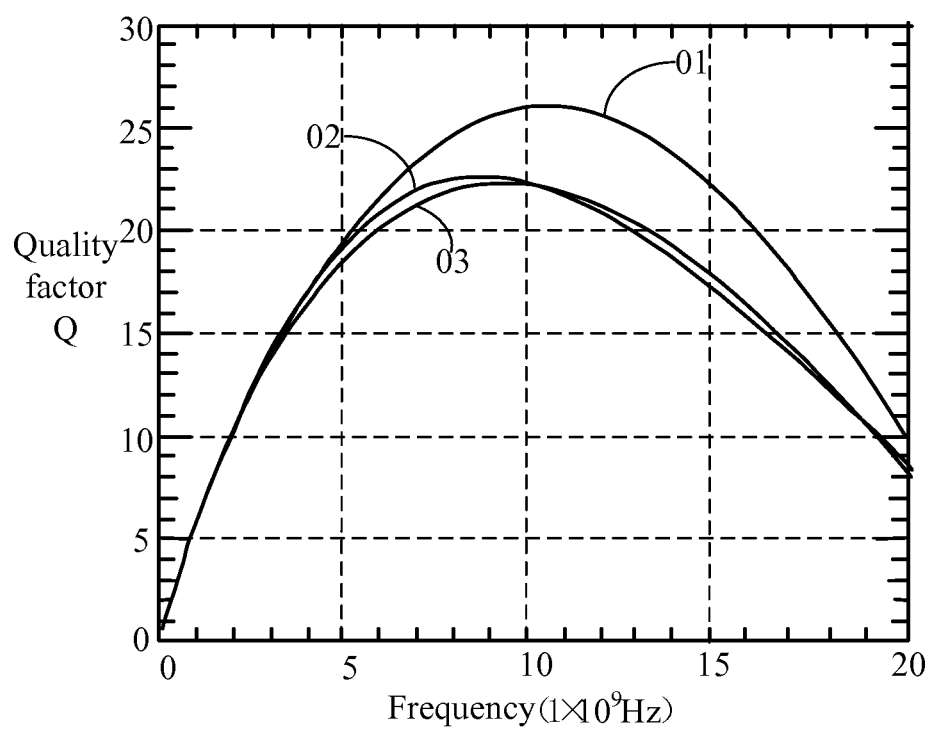
FIG. 13 depicts a relationship between an operating frequency and a Q value of each of an inductor having an exemplary ground shield structure in accordance with various disclosed embodiments, an inductor not having a ground shield structure, and an inductor having an existing ground shield structure.

FIG. 13 depicts a Q value of an exemplary inductor in accordance with various disclosed embodiments, a Q value of an inductor not having a ground shield structure, and a Q value of an inductor having a conventional ground shield structure, versus an operating frequency.

As shown in FIG. 13, a curve 01 corresponds to a Q value of a disclosed inductor having a ground shield structure. A curve 02 corresponds to a Q value of an inductor not having the ground shield structure. A curve 03 corresponds to a Q value of an inductor having a conventional ground shield structure. As shown in FIG. 13, the Q value of the curve 01 reaches a maximum of about 26.8, at a frequency of about 10.4 GHz. The Q value of the curve 02 reaches a maximum of about 22.3, at a frequency of about 8.3 GHz. The Q value of the curve 03 reaches a maximum of about 22.3, at a frequency of about 9.3 GHz. Thus, the disclosed ground shield structure can effectively improve the Q value of the inductor, and the maximum of the Q value can be increased by more than about 17%.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A ground shield structure, comprising:
a substrate;
a dielectric layer disposed on the substrate;
multiple conductive rings disposed in the substrate, in the dielectric layer, and/or on the dielectric layer, wherein each conductive ring of the multiple conductive rings has openings of about three or more, and the openings of the each conductive ring divide the multiple conductive rings into a plurality of sub-conductive rings arranged spaced apart; and
a ground ring electrically connected to each of the plurality of sub-conductive rings.

2. The structure according to claim 1, wherein the openings of about three or more include from about 3 to about 8 openings.

3. The structure according to claim 1, wherein the openings of about three or more are symmetrically configured in the each conductive ring.

4. The structure according to claim 1, wherein the multiple conductive rings are concentric; the each conductive ring of the multiple conductive rings has a same number of the openings equally spaced; and the openings in each of adjacent conductive rings of the multiple conductive rings are consistent in radial directions.

5. The structure according to claim 1, wherein the multiple conductive rings are first-active rings in the substrate, and the structure further includes:
interconnects disposed on the dielectric layer, wherein the ground ring is electrically connected to the plurality of sub-conductive rings via the interconnects.

6. The structure according to claim 5, wherein the interconnects are electrically connected to the plurality of sub-conductive rings at midpoints of the plurality of sub-conductive rings.

7. The structure according to claim 6, wherein the ground ring includes a third-active ring in the substrate, and a projection of the multiple conductive rings on a surface of the substrate is within a range of a projection of the ground ring on the surface of the substrate.

8. The structure according to claim 1, wherein the multiple conductive rings include:
polysilicon rings in the dielectric layer;
first metal rings on the dielectric layer; or
the polysilicon rings in the dielectric layer and the first metal rings on the dielectric layer, wherein the first metal rings are located above the polysilicon rings and are electrically connected to the polysilicon rings.

9. The structure according to claim 8, further including:
multiple second-active rings, wherein the multiple conductive rings are located above the multiple second-active rings and are separated from the multiple second-active rings by the dielectric layer.

10. The structure according to claim 9, further including:
interconnects disposed on the dielectric layer, wherein the ground ring is electrically connected to the plurality of sub-conductive rings via the interconnects.

11. The structure according to claim 10, wherein the first metal rings and the interconnects are configured in a same plane and are connected, and the interconnects are electrically connected to the plurality of sub-conductive rings at midpoints of the plurality of sub-conductive rings.

12. The structure according to claim 11, wherein the ground ring include a third-active ring in the substrate, and a projection of the multiple conductive rings on a surface of the substrate is within a range of a projection of the ground ring on the surface of the substrate.

13. The structure according to claim 12, wherein:
the ground ring further includes a second metal ring on the dielectric layer;
the second metal ring is located above the third-active ring and is electrically connected to the third-active ring; and
the second metal ring, the first metal rings and the interconnects are configured in a same plane and are connected.

14. The structure according to claim 1, wherein a number of the multiple conductive rings ranges from about 2 to about 100.

15. The structure according to claim 1, wherein the each conductive ring has a triangular, square, circular or octagonal shape or has a symmetric shape.

16. The structure according to claim 1, wherein the each conductive ring has a width ranging from about 0.1 micron to about 100 microns.

17. A method for forming a ground shield structure, comprising:
providing a dielectric layer on a substrate;
configuring multiple conductive rings in the substrate, in the dielectric layer, and/or on the dielectric layer, wherein each conductive ring of the multiple conductive rings has openings of about three or more, and the openings of the each conductive ring divide the multiple conductive rings into a plurality of sub-conductive rings arranged spaced apart; and connecting a ground ring to each of the plurality of sub-conductive rings.

18. A semiconductor device, comprising:
a ground shield structure including
- a substrate;
- a dielectric layer disposed on the substrate;
- multiple conductive rings disposed in the substrate, in the dielectric layer, and/or on the dielectric layer, wherein each conductive ring of the multiple conductive rings has openings of about three or more, and the openings of the each conductive ring divide the multiple conductive rings into a plurality of sub-conductive rings arranged spaced apart; and
- a ground ring electrically connected to each of the plurality of sub-conductive rings; and an induction device disposed on the ground shield structure.

19. The device according to claim 18, wherein the induction device includes an inductor, a transformer, or a balun.

20. The device according to claim 18, wherein a projection of the induction device on a surface of the substrate is enclosed by a projection of the ground shield structure on the surface of the substrate.

\* \* \* \* \*